United States Patent
Lloyd

(10) Patent No.: US 11,698,405 B2
(45) Date of Patent: Jul. 11, 2023

(54) METHOD AND SYSTEM FOR DETERMINING AT LEAST ONE CONTRIBUTION OF AT LEAST ONE DEVICE UNDER TEST OF A RADIO FREQUENCY DEVICE CHAIN

(71) Applicant: Rohde & Schwarz GmbH & Co. KG, Munich (DE)

(72) Inventor: Paul Gareth Lloyd, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 20 days.

(21) Appl. No.: 17/372,098

(22) Filed: Jul. 9, 2021

(65) Prior Publication Data

US 2023/0013607 A1    Jan. 19, 2023

(51) Int. Cl.
*G01R 31/28* (2006.01)
(52) U.S. Cl.
CPC .................. *G01R 31/2822* (2013.01)
(58) Field of Classification Search
CPC .............................................. G01R 31/2822
See application file for complete search history.

(56) References Cited

U.S. PATENT DOCUMENTS

| | | | |
|---|---|---|---|
| 2,524,790 A | 10/1950 | Grunwald | |
| 2,831,146 A | 4/1958 | Wu et al. | |
| 3,398,364 A | 8/1968 | Rittenbach | |
| 4,511,917 A | 4/1985 | Kohler et al. | |
| 6,606,583 B1* | 8/2003 | Sternberg | G01R 35/005 702/191 |
| 7,486,067 B2* | 2/2009 | Bossche | G01R 27/28 324/76.22 |
| 7,937,051 B2* | 5/2011 | Vaisanen | G01R 27/28 455/121 |
| 9,618,599 B2 | 4/2017 | Dascher | |
| 2012/0177156 A1* | 7/2012 | Hauske | H04L 7/027 375/343 |
| 2012/0194250 A1* | 8/2012 | Dvorak | H03K 17/005 327/298 |

* cited by examiner

*Primary Examiner* — Akm Zakaria
(74) *Attorney, Agent, or Firm* — Christensen O'Connor Johnson Kindness PLLC

(57) ABSTRACT

A method and a system for determining at least one contribution of at least one device under test (DUT) are described. The DUT may be part of a radio frequency (RF) device chain. The method includes capturing a first signal portion at a first node associated with an input of the DUT and capturing a second signal portion at a second node associated with an output of the DUT. The first signal portion and the second signal portion are captured quasi-simultaneously. The method may also include aligning the captured first signal portion and the captured second signal portion with each other temporally, and determining the contribution of the DUT by comparing the first signal portion and the second signal portion.

19 Claims, 3 Drawing Sheets

METHOD AND SYSTEM FOR DETERMINING AT LEAST ONE CONTRIBUTION OF AT LEAST ONE DEVICE UNDER TEST OF A RADIO FREQUENCY DEVICE CHAIN

FIELD OF THE DISCLOSURE

Embodiments of the present disclosure generally relate to a method and system for determining at least one contribution of at least one device under test of a radio frequency device chain.

BACKGROUND

Electronic devices usually have to be tested with regard to their signal characteristics, for example in radio frequency (RF, also called high frequency) applications. This testing is typically conducted on a single device basis meaning that a device under test (DUT) is separated from other devices and tested accordingly. However, if the device is already appropriately installed in a multi device system, such as a RF device chain, isolation of the device under test may not be readily available or may require time consuming and cost intensive maintenance work, particularly due to re-calibration of the RF device chain.

In an alternative, testing an entire chain of devices does not lead to determination of the contribution of a specific single device within the chain as the devices of the chain interact with each other with regard to their electronic properties, in particular in the field of RF applications.

Extracting the contribution of a single device is further hindered since the signal analysis may not be performed simultaneously at different points of the chain. Given that all real systems are time-variant, this contributes a systematic error which cannot be readily ruled out.

Where a signal such as an input signal for device under test is unknown, the problem gets even more complex because in addition to the time variance problem the signal may not even be repetitive or usefully autocorrelative. Hence, a reference signal of the DUT may be required in order to apply autocorrelation. Even reference signals originating from manufacturers control routines may be inappropriate since due to several effects the signal properties of the DUT may have changed. Accordingly, using a former reference signal may lead to further systematic errors.

Hence, there is need for a mechanism to reliably determine a contribution of a DUT of a RF device chain.

SUMMARY

The subject matter of the independent claims satisfies the respective need or others. Further embodiments are indicated within the dependent claims and the following description, each of which, individually or in combination, may represent aspects of the disclosure.

Embodiments of the present disclosure relate to a method for determining at least one contribution of at least one device under test (DUT) of a radio frequency (RF) device chain. In an embodiment, the method comprises the step of capturing a first signal portion at a first node associated with an input of the DUT. The method also comprises the step of capturing a second signal portion at a second node associated with an output of the DUT. The first signal portion and the second signal portion are captured quasi-simultaneously. Also, the method comprises the step of temporally aligning the captured first signal portion and the captured second signal portion with each other. Additionally, the method comprises the step of determining the contribution of the DUT by comparing the first signal portion and the second signal portion.

According to a different aspect, some embodiments of the present disclosure relate to a system for determining at least one contribution of at least one DUT. The DUT may be part of a RF device chain. In an embodiment, the system comprises a DUT coupled to an input signal source and to an output signal sink. A first time domain capturing device is arranged and configured to capture a first signal portion at a first node associated with an input of the DUT. The system also comprises at least a second time domain capturing device arranged and configured to capture a second signal portion at a second node associated with an output of the DUT quasi-simultaneously with the first signal portion. The system further comprises a processing unit comprising circuitry configured to determine the contribution of the DUT by comparing the first signal portion and the second signal portion.

Based on the quasi-simultaneous acquisition of the first signal portion and the second signal portion at nodes associated with the input and the output of the DUT, respectively, the contribution of the respective DUT may be appropriately determined independent from remaining devices of the RF device chain. Put differently, the time-variance of the RF device chain with respect to the specific DUT may advantageously be compensated such that precise determination of the contribution of the DUT is achieved. Additional maintenance work to separate the DUT may be avoided. The method as well as the system do not rely on knowledge of the signals based on which the DUT is driven. Thus, even if the DUT is driven by unknown signals, its contribution to the RF device chain may be precisely determined. Due to the quasi-simultaneous acquisition of the first signal portion and the second signal portion, the need for a reference signal to determine the contribution of the DUT is avoided.

Accordingly, it is avoided that a priori knowledge of the signal used for testing the device under test is required. Moreover, the contribution(s) of the device under test within the RF device chain can be evaluated accurately while eliminating time-variance systematic error.

The time domain capturing devices may capture the respective signal portions for post-processing or real-time analysis, namely streaming.

The first signal portion may be captured prior to a RF processing circuit of the DUT and the second signal portion may be captured after the RF processing circuit of the DUT. The RF processing circuit may be considered internal circuitry of the DUT which influences the RF signal properties of the DUT when processing the RF signal. In other words, the RF processing represents a portion of the DUT which properties are to be determined. Accordingly, the nodes associated with the DUT, respectively used for capturing the first signal portion and the second signal portion, may also be coupled to the RF device chain outside the DUT. Hence, the DUT being a part of the RF device chain may be approached omitting time consuming and cost intensive maintenance work.

According to an aspect, the processing unit includes circuitry configured to align the captured first signal portion and the captured second signal portion with each other. The processing unit may align the captured first signal portion and the captured second signal portion to each other at least with respect to a time domain. Temporal variations between the first signal portion and the second signal portion may thus be compensated. Hence, the alignment of the respective signal portions captured takes place in the time domain at least.

In some examples, the captured first signal portion and the captured second signal portion may be aligned to each other using an autocorrelation function. The autocorrelation functionality may be applied by the processing unit. Based on the autocorrelation function remaining differences between the first signal portion and the second signal portion may be compensated. The determination of the contribution of the DUT may be further improved.

Moreover, a time domain correlation may take place in order to temporally align the signal portions captured.

To establish a quasi-simultaneous capturing of the first signal portion and the second signal portion a co-triggering signal may be applied. For example, the system may further comprise a triggering circuit to co-trigger the first time domain capturing device and the at least second time domain capturing device. The triggering circuit may be part of the processing unit. Then, the capturing may simultaneously be initiated such that any time-variance influences may be compensated.

For instance, a trigger with a defined offset is used which takes the propagation time of the RF signal between both nodes into account.

When autocorrelating the first signal portion and the second signal portion to each other, triggering signals may be included in the adaption process. Consequently, the alignment may even be improved.

In an alternative, the first signal portion and the second signal portion may be selected from a respective basic first signal portion and a respective basic second signal portion such that the selected first signal portion and the selected second signal portion may be quasi-simultaneous to each other. In some examples, the processing unit includes circuitry configured to select the first signal portion and the second signal portion from a respective basic first signal portion and a respective basic second signal portion such that the selected first signal portion and the selected second signal portion are quasi-simultaneous to each other.

Put differently, a basic first signal portion may be acquired at the first node and a basic second signal portion may be acquired at the second node. The basic first signal portion and the basic second signal portion may comprise time information. Subsequently, from the basic signal portions a first signal portion and a second signal portion may be extracted such that their time information correspond to each other. Non-corresponding signal portions, such as initial or end portions, may be excluded.

The first signal portion may also be captured at an input port or an internal input node of the DUT. Also, the first time domain signal capturing device may be coupled to an input port of the DUT or an internal input node of the DUT.

The second signal portion may also be captured at an output port or an internal output node of the DUT. Further, the second time domain signal capturing device may be coupled to an output port or an internal output node of the DUT.

Capturing the first signal portion at an internal input node may be achieved by a sensing probe. The sensing probe may be a magnetic field and/or electric field sensing probe. Hence, the sensing probe may be configured to sense an electric and/or magnetic near field without direct (galvanic) connection to the internal input node. Accordingly, a galvanic isolation between the sensing probe and the circuitry of the RF chain may be established by using a so-configured sensing probe.

Hence, noise contribution may at least partially be avoided. Furthermore, the frequency range of the sensing probe may also be increased arbitrarily by the specific design of the probe. Hence, evaluation of even larger frequency ranges may be achieved.

Likewise, the second signal portion may be captured at the internal output node using another sensing probe. The sensing probes for sensing the first signal portion and the second signal portion may be of similar type, such as but not limited to e.g. Rohde & Schwarz HZ-15 near field probes.

This means that the nodes or the respective time domain capturing devices may be coupled to the DUT at an input port or an output port or they may be coupled to the RF device chain prior to the input port or subsequent to the output port. In an alternative, the nodes or the respective time domain capturing devices may also be coupled inside the DUT subsequent to the input port and prior to the output port. Put differently, a first node or a first time domain capturing device may be associated with the input port and a second node or a second time domain capturing devices may be associated with the output port of the DUT on opposite sides of the RF processing circuit of the DUT. Therefore, the contribution of the DUT which may be determined by the RF processing circuit may be approached from the upstream and the downstream sides with respect to the RF processing circuit in various manners according to the respective desires.

Generally, the respective location of the node(s) depends on the specific part or rather portion to be characterized. For fully characterizing the influence of the entire device under test, the nodes are located close to the input and output. When characterizing a certain part of the DUT, the nodes are located internally as close as possible to the respective part of the DUT to be characterized, e.g., the RF signal processing circuit.

The first time domain signal capturing device and the at least second time domain signal capturing device may be at least one of scalar capturing devices or in-phase and quadrature (IQ) signal capturing devices. Accordingly, phase as well as amplitude information may be simultaneously captured.

According to some embodiments, the method may further comprise the step of determining at least an error vector magnitude (EVM) figure of the DUT based on its contribution, for example an absolute EVM figure. The EVM may be used to quantify the performance of the DUT. The EVM quantizes the deviation of the DUT with regard to its RF signal properties relative to the ideal properties if imperfections and influences of the RF device chain are neglected. The EVM may be determined with regard to the nodes individually or with regard to the combination of the nodes at which the first signal portion and the second signal portion are captured.

According to some embodiments, the method may also comprise the step of determining at least a degradation transfer function of the DUT based on its contribution. The degradation transfer function may be considered to describe alteration due to the RF processing circuit at the second node relative to the first node. The degradation transfer function may also be determined based on the evaluated EVM figures. Determining the degradation transfer function generally may require that at least one signal portion captured either at the first node or the second node is known.

In this regard, the EVM figures and the degradation transfer function of the DUT may for example be determined by the processing unit of the system, for example based on the contribution of the DUT.

Additionally, the method may comprise the step of analyzing the contribution of the DUT with regard to at least one of time domain, frequency domain, and amplitude domain, or a combination thereof. In some embodiments, the processing unit may be configured to analyze the contribution of the at least one DUT with regard to at least one of time domain, frequency domain, and amplitude domain, or a combination thereof. In other words, the RF processing circuit of the DUT may be characterized with regard to the time domain, the frequency domain, the amplitude domain, or a combination thereof. In effect, this may provide the possibility to adapt the overall signal properties of the RF device chain. Then, the RF device chain may better fit the respective use case.

Throughout the present disclosure RF signals (high frequency signals) may have a frequency within the range of 1 MHz to 100 GHz. High frequency applications are used in manifold applications nowadays. Accordingly, DUTs may be investigated with regard to their signal properties and performances utilizing the so-designed method.

In further examples, n contributions of n DUTs may be determined. In these examples, the system may comprise at least n+1 time domain signal capturing devices. For each of the n DUTs at least a pair of signal portions prior and subsequent to the respective DUT, for example a part thereof to be characterized, may be quasi-simultaneously captured by the at least n+1 time domain signal capturing devices. The respective contribution of a DUT may then be determined by comparing the signal portions of the pair of signal portions captured with regard to the respective DUT. In other words, the system may also be applied to determine the contribution of a group or collection of DUTs at once. The group may comprise at least two DUTs. This may lead to the determination of the contribution of a portion of the RF device chain. Furthermore, the contributions of DUTs do not necessarily have to be determined based on a single DUT basis, as the contribution of multiple DUTs may also be determined based on a combined approach. This may be beneficial in terms of the overall time required for the determination process. In general, n may be an integer number of 1 or greater.

In some embodiments, the term "module" or "unit" refers to or includes, inter alia, a combination of hardware (e.g. a processor such as an integrated circuit, digital circuits or other circuitry) and software (e.g. machine- or processor-executable instructions, commands, or code such as firmware, programming, or object code). Furthermore, a combination of hardware and software may include hardware only (i.e. a hardware element with no software elements), software hosted at hardware (e.g. software that is stored at a memory and executed or interpreted at a processor), or hardware with the software hosted thereon. In some embodiments, the hardware may, inter alia, comprise a CPU, a GPU, an FPGA, an ASIC, or other types of electronic circuitry.

A summary of certain embodiments disclosed herein is set forth above. It should be understood that these aspects are presented merely to provide a brief summary of these embodiments and that these aspects are not intended to limit the scope of this disclosure. This disclosure may encompass a variety of aspects that may not be set forth below.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth above in connection with the appended drawings, where like numerals reference like elements, are intended as a description of various embodiments of the present disclosure and are not intended to represent the only embodiments. Each embodiment described in this disclosure is provided merely as an example or illustration and should not be construed as preferred or advantageous over other embodiments. The illustrative examples provided herein are not intended to be exhaustive or to limit the disclosure to the precise forms disclosed. Similarly, any steps described herein may be interchangeable with other steps, or combinations of steps, in order to achieve the same or substantially similar result. Moreover, some of the method steps can be carried serially or in parallel, or in any order unless specifically expressed or understood in the context of other method steps.

In the foregoing description, specific details are set forth to provide a thorough understanding of exemplary embodiments of the present disclosure. It will be apparent to one skilled in the art, however, that the embodiments disclosed herein may be practiced without embodying all of the specific details. In some instances, well-known process steps have not been described in detail in order not to unnecessarily obscure various aspects of the present disclosure.

Further, it will be appreciated that embodiments of the present disclosure may employ any combination of features described herein. For example, all of the features disclosed hereinafter with respect to the example embodiments and/or the accompanying figures can alone or in any sub-combination be combined with features of the aspects of the present disclosure including features of any embodiments thereof.

Throughout this specification, terms of art may be used. These terms are to take on their ordinary meaning in the art from which they come, unless specifically defined herein or the context of their use would clearly suggest otherwise.

Figure 1:
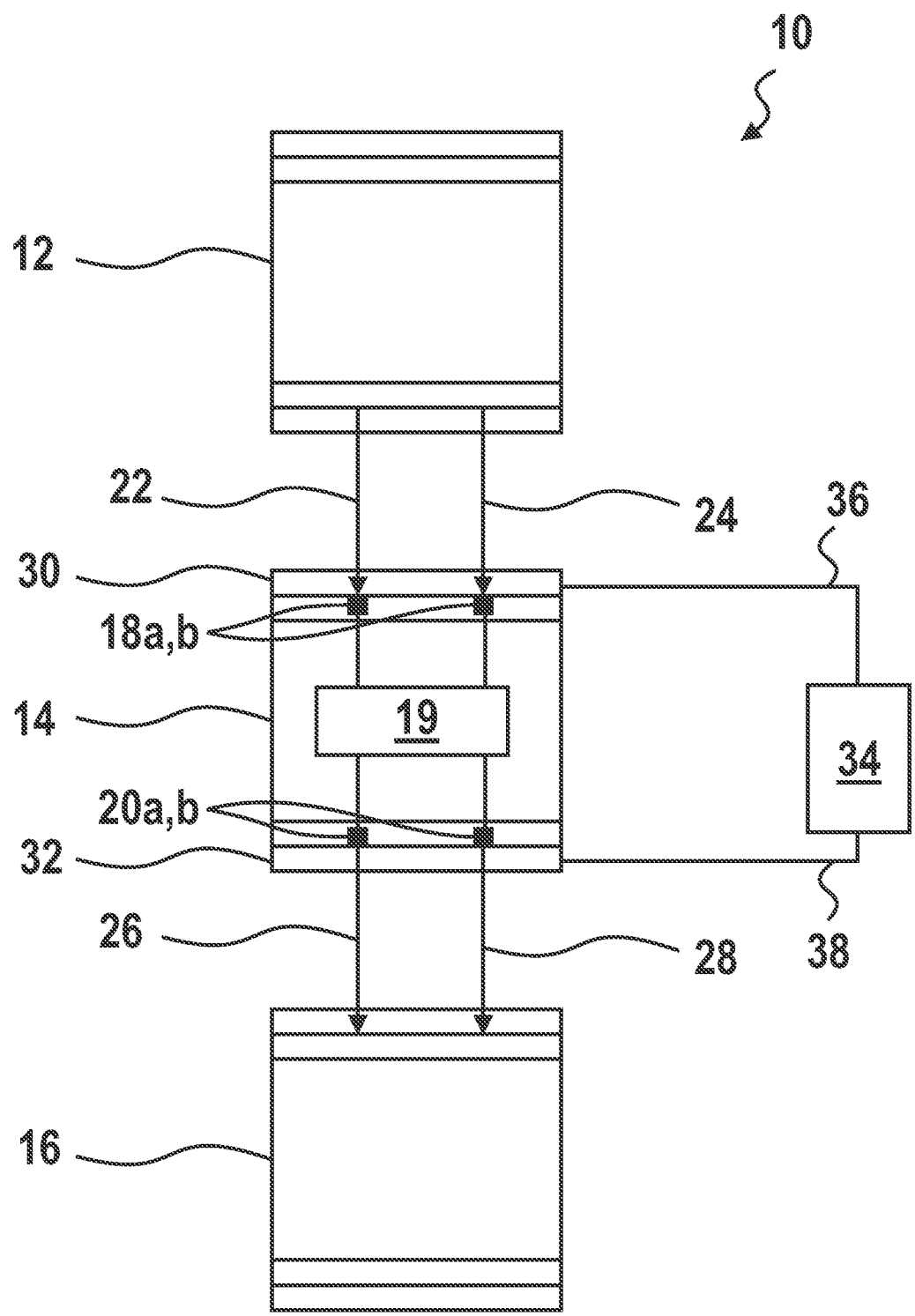
FIG. 1 is a schematic drawing of a representative system for determining at least one contribution of at least one DUT.

FIG. 1 is a schematic drawing of a system 10 for determining at least one contribution of at least one device under test (DUT) 14. The system 10 comprises a chain of radio frequency (RF) devices. In some embodiments, a first DUT 12 is coupled to a second DUT 14 which itself is coupled to a third DUT 16. The mechanism of determining the contribution of a DUT will be exemplarily described with regard to the second DUT 14.

The DUT 14 comprises input ports 18a,b and output ports 20a,b. Via the input ports 18a,b the DUT 14 is coupled to the first DUT 12 using two signal connections 22, 24. Put differently, the first DUT 12 is arranged upstream with respect to the second DUT 14. Therefore, the first DUT 12 represents a signal source relative to the second DUT 14. Via the output ports 20a,b the DUT 14 is coupled to the third DUT 16 using two signal connections 26, 28. In other words, the third DUT 16 is arranged downstream with respect to the second DUT 14. The third DUT 16 represents a signal sink relative to the second DUT 14.

Between the input ports 18*a,b* and the output ports 20*a,b* a RF processing circuit 19 of the DUT 14 is arranged. Based on the RF processing circuit 19 the contribution of the DUT 14 as part of the RF device chain is determined.

Generally, the RF device chain shown may relate to forwarding a signal from an antenna to a receiver. Alternatively, the RF chain may also relate to a signal from a modem/transceiver to a transmitter. Thus, DUT 14 may relate to an antenna, a receiver, a modem/transceiver, a transmitter or a termination.

A first time domain signal capturing device 30 is associated with the input ports 18*a,b* of the DUT 14. A second time domain signal capturing device 32 is associated with the output ports 20*a,b* of the DUT 14.

The time domain signal capturing devices 30, 32 may be, for example, at least one of scalar capturing devices or in-phase and quadrature (IQ) signal capturing devices. Thus, the phase as well as the amplitude of the respective signal portion may be simultaneously captured by the time domain signal capturing devices 30, 32.

The system 10 also comprises a processing unit 34 including circuitry for implementing various functionalities described herein. In the shown embodiment, the processing unit 34 is separately formed with respect to the time domain signal capturing devices 30, 32 and the DUTs 12-16.

According to the present example, the processing unit 34 comprises a triggering circuit, for example an integrated triggering circuit. The processing unit 34 is connected to the first time domain signal capturing device 30 via a first triggering connection 36. The processing unit 34 is connected to the second time domain signal capturing device 32 via a second triggering connection 38. Thus, the processing unit 34 is enabled to control acquisition of the time domain signal capturing devices 30, 32, e.g., the capturing of the respective signal portions.

Using the first time domain signal capturing device 30 a first signal portion associated with the input ports 18*a,b* is captured. Using the second time domain signal capturing device 32 a second signal portion associated with the output ports 20*a,b* is captured. The first signal portion and the second signal portion are captured quasi-simultaneous. The quasi-simultaneous acquisition is achieved by a triggering signal provided by the processing unit 34. The processing unit 34 may then be applied to compare the first and second signal portions to determine the RF contribution of the DUT 14.

In some examples, the processing unit 34 may also include circuitry configured to determine a degradation transfer function of the DUT 14 with respect to the RF processing circuit 19. Also, the processing unit 34 may also include circuitry configured to determine the error vector magnitude (EVM) figure to quantify the performance of the DUT 14 or to evaluate the contribution of the DUT 14 with regard to the time domain, frequency domain, amplitude domain, or a combination thereof.

In the embodiment of FIG. 1, the system 10 depicts a particular case of a single DUT 14 being investigated, wherein its RF contribution is determined based on two time domain capturing devices.

Figure 2:
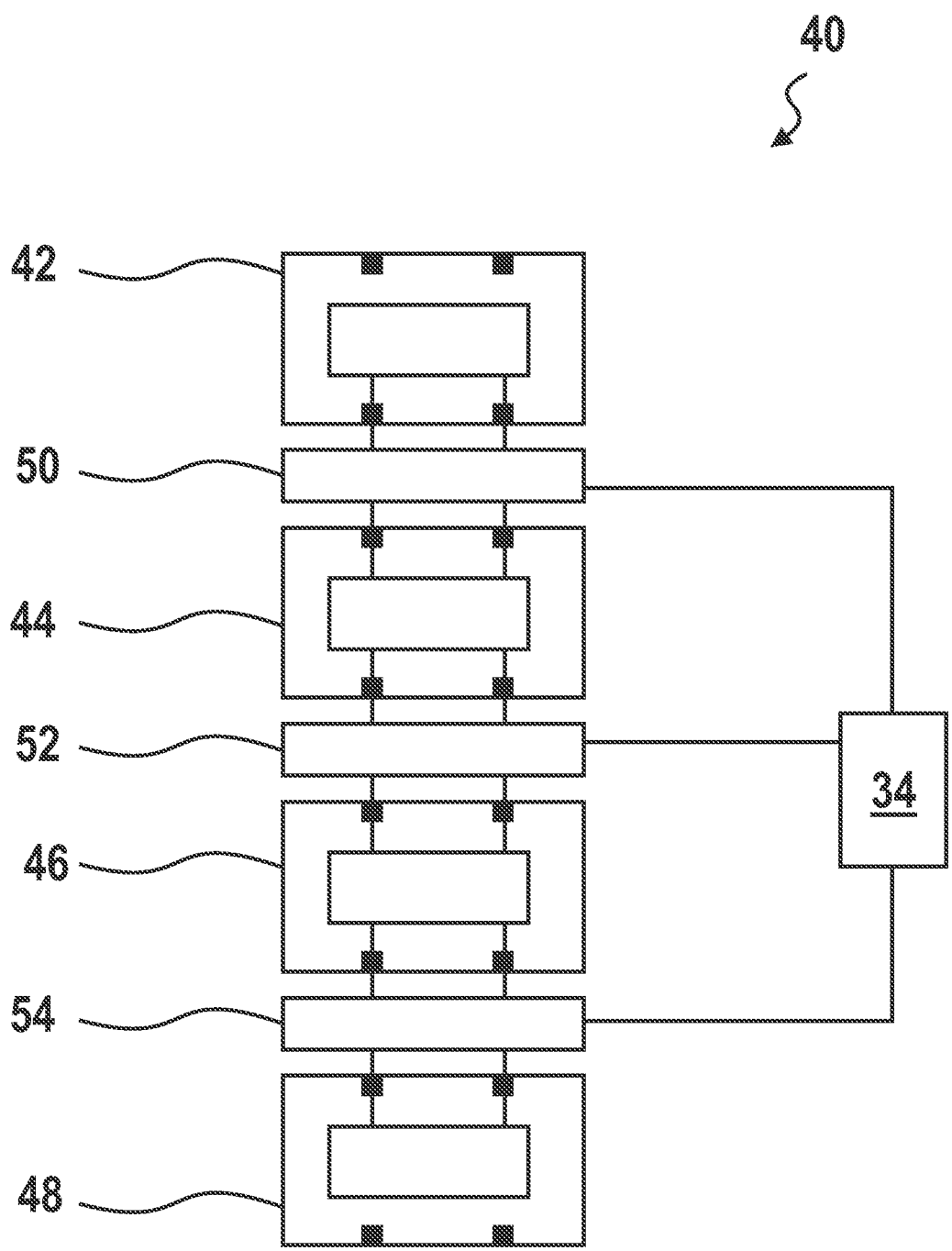
FIG. 2 is a schematic drawing of a representative system for determining at least one contribution of n DUTs according to an embodiment.

FIG. 2 is a schematic drawing of a system 40 for determining at least contributions of n DUTs according to an embodiment of the disclosure. The embodiment generally corresponds to the system 10 of FIG. 1. For this reason, the system 40 is discussed only with regard to the differences.

According to the system 40, the contribution of n DUTs 44, 46 are determined such that n DUTs are investigated (simultaneously), where n=2. The system 40 therefore depicts an example where the contribution of a larger portion of the RF device chain is determined at once, e.g., of two separately formed devices.

In this example, the time domain capturing devices 50, 52, 54 are arranged between the DUTs 42, 44, 46, 48. According to this example, for n investigated DUTs 44, 46 n+1 time domain capturing devices 50, 52, 54 are applied. According to this embodiment, the time domain capturing devices 50, 52, 54 are all coupled to the (separately formed) processing unit 34 for triggering. Hence, the processing unit 34 co-triggers the respective time domain capturing devices 50, 52, 54 to capture the respective signal portions at the nodes at defined times. In some embodiments, a certain offset may be set of the different time domain capturing devices 50, 52, 54 that takes the propagation time of the RF signal between the nodes into account at which the time domain capturing devices 50, 52, 54 are coupled.

The time domain capturing devices 50, 52, 54 may be used in twofold manner, meaning with respect two both adjacently arranged DUTs. Exemplarily, the center time domain capturing device 52 is used with regard to both adjacent DUTs 44, 46, e.g., the node associated with the output of DUT 44 and the node associated with the input of DUT 46 provided that the RF signals propagate from DUT 44 towards DUT 46.

In an alternative, the central time domain capturing device 52 may be omitted and the DUTs 44, 46 may be investigated in a combined manner. Then, the contribution to the RF device chain originating from the combination of both DUTs 44, 46 may be determined as a whole. In this case, the number of required time domain capturing devices may be readily reduced.

In general, n may be an integer number of 1 or greater.

Figure 3:
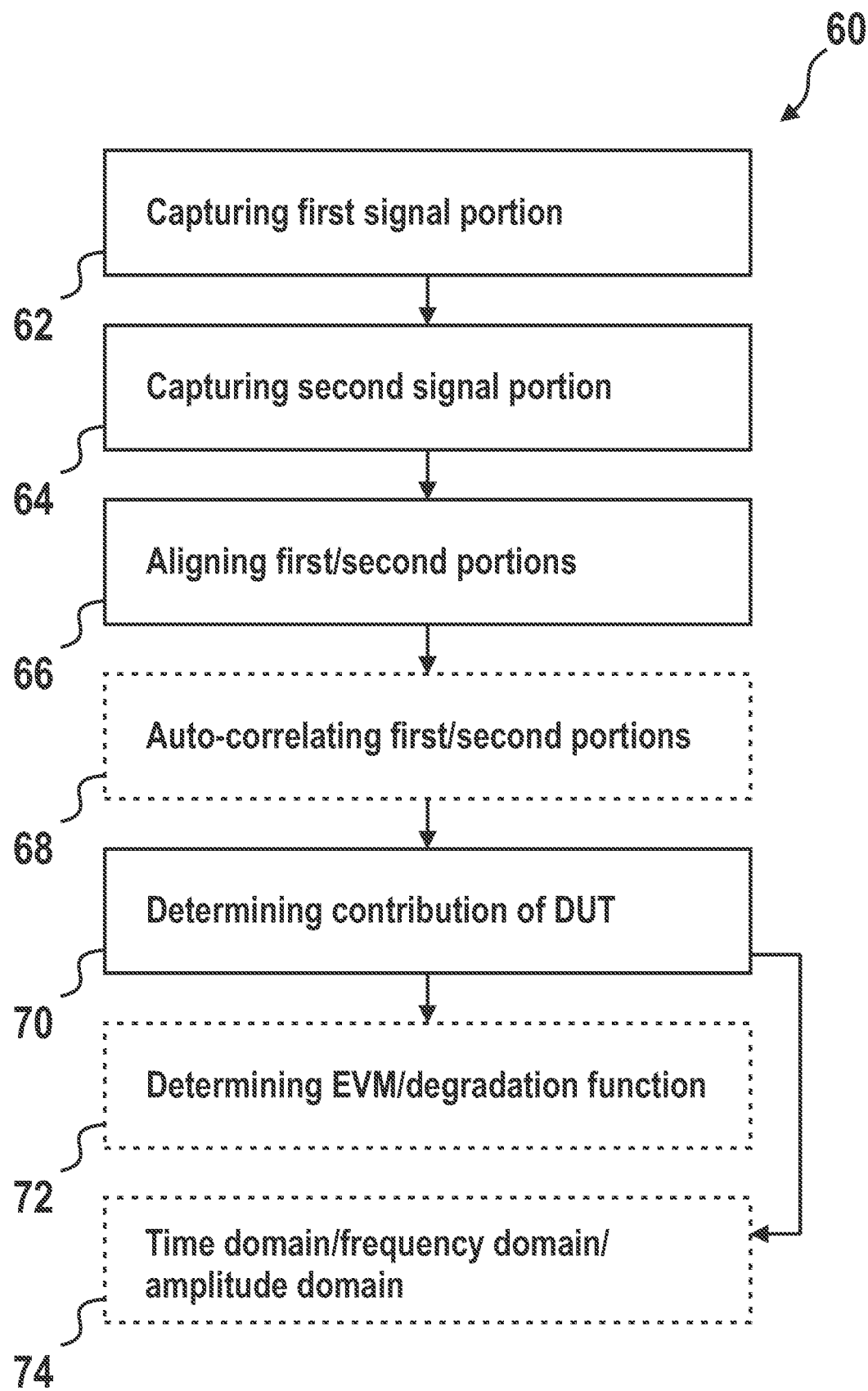
FIG. 3 is a schematic drawing of a representative method for determining at least one contribution of at least one DUT of a RF device chain.

FIG. 3 is a schematic drawing of a representative method 60 for determining at least one contribution of at least one DUT of the RF device chain that may encompass several DUTs or rather several RF processing devices. Optional steps are depicted in dashed boxes.

The method 60 comprises the step 62 of capturing a first signal portion. For example, the first signal portion may be captured using a first time domain capturing device coupled to a first node associated with an input port of the DUT. Furthermore, the method 60 comprises the step 64 of capturing a second signal portion. Similarly, the second signal portion may be captured using a second time domain capturing device coupled to a second node associated with an output port of the DUT. Generally, steps 62 and 64 are executed such that the first signal portion and the second signal portion are captured quasi-simultaneously.

As mentioned above, this may be ensured by co-triggering the time domain capturing devices appropriately.

Alternatively, the time domain capturing devices may also free run, wherein the respective time alignment takes place in a post-processing. Hence, the quasi-simultaneous capturing is ensured in a post-processing. For instance, long captures are taken by the time domain capturing devices wherein certain portions of the long captures are selected in a post-processing, thereby ensuring the quasi-simultaneous capturing.

In other words, a basic first signal portion may be acquired at the first node and a basic second signal portion may be acquired at the second node. The basic first signal portion and the basic second signal portion may comprise time information. Subsequently, from the basic signal portions a first signal portion and a second signal portion may be extracted (in a post-processing or rather in real time). Thus, the respective basic signal portions may relate to the long captures gathered from the time domain signal capturing devices.

In general, the first signal portion may be captured directly at an input port or an internal input node of the DUT. Hence, the first time domain signal capturing device may be coupled to an input port of the DUT directly or an internal input node of the DUT. Further, the second signal portion may be captured directly at an output port or an internal output node of the DUT. Hence, the second time domain signal capturing device may be coupled to an output port of the DUT directly or an internal output node of the DUT.

Capturing the first signal portion at an internal input node as well as capturing the second signal portion at an internal output node may be achieved by sensing probes which are configured so as to establish a galvanic isolation between the sensing probes and the RF chain circuitry. The sensing probes may for example comprise a magnetic field and/or electric field sensing probe.

Subsequently, in step 66 of the method 60, the first signal portion and the second signal portion are aligned with each other, at least with regard to a time domain. In other words, the respective signal portions are aligned to each other based on a time information such that offsets between the signal portions are compensated.

Optionally, in step 68 an autocorrelation function may be applied. Step 68 may also be part of step 66. The autocorrelation function may take triggering signals applied to the time domain capturing devices and/or offsets between the signal portions into account to further improve the precision of the alignment procedure. Step 68 may for example simplify the aligning procedure.

In subsequent step 70, the contribution of the DUT is determined utilizing a processing unit. Hence, the contribution of the DUT to a RF device chain may be appropriately evaluated without separating the DUT from the RF device chain previously.

In optional step 72, at least one error vector magnitude (EVM) figure and/or a degradation transfer function of the DUT may be determined based on the DUT's contribution. In some embodiments, EVM figures may be determined for both nodes associated with the input port and the output port of the DUT, respectively. The degradation transfer function may then describe how the RF signal is influenced or altered by the intrinsic RF processing circuit of the DUT.

In optional step 74, the contribution of the DUT may be evaluated with regard to at least one of a time domain, a frequency domain, and an amplitude domain, or a combination thereof. Thus, the RF processing circuit of the DUT may be further characterized.

The optional steps 72, 74 may be applied in parallel or subsequent to each other. The order of the steps may be modified according to desires.

Based on the evaluated contribution of the DUT the performance of the RF device chain may be improved.

Certain embodiments disclosed herein, for example the respective module(s), unit(s), device(s), etc., utilize circuitry (e.g., one or more circuits) in order to implement standards, protocols, methodologies or technologies disclosed herein, operably couple two or more components, generate information, process information, analyze information, generate signals, sense or capture signals, encode/decode signals, convert signals, transmit and/or receive signals, control other devices, etc. Circuitry of any type can be used. It will be appreciated that the term "information" can be use synonymously with the term "signals" in this paragraph. It will be further appreciated that the terms "circuitry," "circuit," "one or more circuits," etc., can be used synonymously herein.

In an embodiment, circuitry includes, among other things, one or more computing devices such as a processor (e.g., a microprocessor), a central processing unit (CPU), a digital signal processor (DSP), an application-specific integrated circuit (ASIC), a field-programmable gate array (FPGA), a system on a chip (SoC), or the like, or any combinations thereof, and can include discrete digital or analog circuit elements or electronics, or combinations thereof. In an embodiment, circuitry includes hardware circuit implementations (e.g., implementations in analog circuitry, implementations in digital circuitry, and the like, and combinations thereof).

The present application may reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A and B" is equivalent to "A and/or B" or vice versa, namely "A" alone, "B" alone or "A and B.". Similarly, the phrase "at least one of A, B, and C," for example, means (A), (B), (C), (A and B), (A and C), (B and C), or (A, B, and C), including all further possible permutations when greater than three elements are listed.

Although the disclosure has been illustrated and described with respect to one or more implementations, equivalent alterations and modifications will occur to others skilled in the art upon the reading and understanding of this specification and the annexed drawings. In addition, while a particular feature of the disclosure may have been disclosed with respect to only one of several implementations, such feature may be combined with one or more other features of the other implementations as may be desired and advantageous for any given or particular application.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A method for determining at least one contribution of at least one device under test of a radio frequency device chain, the method comprising:
   capturing a first signal portion at a first node associated with an input of the device under test;
   capturing a second signal portion at a second node associated with an output of the device under test, wherein the first signal portion and the second signal portion are captured quasi-simultaneously;

aligning the captured first signal portion and the captured second signal portion with each other temporally; and determining the contribution of the device under test by comparing the first signal portion and the second signal portion, wherein the first signal portion and the second signal portion are selected from a respective basic first signal portion and a respective basic second signal portion, the basic first signal portion and the basic second signal portion comprising time information, such that the selected first signal portion and the selected second signal portion are quasi-simultaneous to each other insofar as their time information correspond to each other and non-corresponding signal portions are excluded.

2. The method of claim 1, wherein the first signal portion is captured prior to a radio frequency processing circuit of the device under test and the second signal portion is captured after the radio frequency processing circuit of the device under test.

3. The method of claim 1, wherein the captured first signal portion and the captured second signal portion are aligned to each other using an autocorrelation function.

4. The method of claim 1, wherein the quasi-simultaneous capturing of the first signal portion and the second signal portion is established by a co-triggering signal.

5. The method of claim 1, wherein the first signal portion is captured at an input port or an internal input node of the device under test.

6. The method of claim 1, wherein the second signal portion is captured at an output port or an internal output node of the device under test.

7. The method of claim 1, wherein the method further comprises determining at least one of an error vector magnitude figure or a degradation transfer function of the device under test based on its contribution.

8. The method of claim 1, wherein the method further comprises analyzing the contribution of the device under test with regard to at least one of time domain, frequency domain, or amplitude domain, or a combination thereof.

9. A system for determining at least one contribution of at least one device under test, the system comprising:

a device under test coupled to an input signal source and to an output signal sink, a first time domain signal capturing device arranged and configured to capture a first signal portion at a first node associated with an input of the device under test, at least a second time domain signal capturing device arranged and configured to capture a second signal portion at a second node associated with an output of the device under test quasi-simultaneously with the first signal portion, and a processing circuit configured to determine the contribution of the device under test by comparing the first signal portion and the second signal portion, wherein the processing circuit is configured to select the first signal portion and the second signal portion from a respective basic first signal portion and a respective basic second signal portion, the basic first signal portion and the basic second signal portion comprising time information, such that the selected first signal portion and the selected second signal portion are quasi-simultaneous to each other, insofar as their time information correspond to each other and non-corresponding signal portions are excluded.

10. The system according to claim 9, further comprising a triggering circuit to co-trigger the first time domain signal capturing device and the at least second time domain signal capturing device.

11. The system according to claim 9, wherein the processing circuit is configured to align the captured first signal portion and the captured second signal portion with each other.

12. The system according to claim 10, wherein the processing circuit is configured to align the captured first signal portion and the captured second signal portion to each other at least with respect to a time domain.

13. The system according to claim 9, wherein the processing circuit is configured to align the captured first signal portion and the captured second signal portion with each other based on an autocorrelation functionality.

14. The system according to claim 9, wherein the first time domain signal capturing device is coupled to an input port or an internal input node of the device under test.

15. The system according to claim 9, wherein the second time domain signal capturing device is coupled to an output port or an internal output node of the device under test.

16. The system according to claim 9, wherein the first time domain signal capturing device and the at least second time domain signal capturing device are at least one of scalar capturing devices or in-phase and quadrature (IQ) signal capturing devices.

17. The system according to claim 9, wherein the processing circuit is configured to analyze the contribution of the at least one device under test with regard to at least one of time domain, frequency domain, or amplitude domain, or a combination thereof.

18. The system according to claim 9, wherein the processing circuit is configured to determine at least one of an error vector magnitude figure and a degradation transfer function of the device under test based on its contribution.

19. The system according to claim 9, wherein n contributions of n devices under test are determined, wherein the system comprises at least n+1 time domain signal capturing devices, wherein for each of the n devices under test at least a pair of signal portions prior and subsequent to the respective device under test are quasi-simultaneously captured by the at least n+1 time domain signal capturing devices, wherein the respective contribution of a device under test is determined by comparing the signal portions of the pair of signal portions captured with regard to the respective device under test, and wherein n is an integer number of 1 or greater.

* * * * *